(12) United States Patent
Sasaki et al.

(10) Patent No.: US 7,306,985 B2
(45) Date of Patent: Dec. 11, 2007

(54) METHOD FOR MANUFACTURING SEMICONDUCTOR DEVICE INCLUDING HEAT TREATING WITH A FLASH LAMP

(75) Inventors: Takaoki Sasaki, Ibaraki (JP); Takeshi Hoshi, Kanagawa (JP)

(73) Assignee: Seiko Epson Corporation (JP)

( * ) Notice: Subject to any disclaimer, the term of this patent is extended or adjusted under 35 U.S.C. 154(b) by 121 days.

(21) Appl. No.: 10/916,457

(22) Filed: Aug. 12, 2004

(65) Prior Publication Data

US 2005/0045967 A1 Mar. 3, 2005

(30) Foreign Application Priority Data

Aug. 29, 2003 (JP) ............................. 2003-307146

(51) Int. Cl.
*H01L 21/8238* (2006.01)

(52) U.S. Cl. .................... 438/216; 438/287; 438/787; 438/791

(58) Field of Classification Search ................ 438/216, 438/287, 308, 787, 788, 791, 792, 795
See application file for complete search history.

(56) References Cited

U.S. PATENT DOCUMENTS

| 4,962,065 | A | * | 10/1990 | Brown et al. ................ 438/792 |
| 5,969,397 | A | | 10/1999 | Grider et al. |
| 6,020,024 | A | * | 2/2000 | Maiti et al. .................. 438/287 |
| 6,531,368 | B1 | * | 3/2003 | Yu ............................. 438/306 |
| 6,597,046 | B1 | | 7/2003 | Chan et al. |
| 6,632,729 | B1 | * | 10/2003 | Paton ......................... 438/535 |
| 6,642,131 | B2 | | 11/2003 | Harada |
| 6,696,735 | B2 | | 2/2004 | Fukui |
| 6,713,358 | B1 | * | 3/2004 | Chau et al. .................. 438/287 |
| 6,809,370 | B1 | * | 10/2004 | Colombo et al. ............. 257/310 |
| 6,812,159 | B2 | * | 11/2004 | Wieczorek et al. ........... 438/778 |
| 6,849,831 | B2 | * | 2/2005 | Timans et al. ............... 219/390 |
| 6,867,101 | B1 | * | 3/2005 | Yu ............................. 438/287 |
| 7,001,814 | B1 | * | 2/2006 | Halliyal et al. .............. 438/287 |
| 7,022,625 | B2 | * | 4/2006 | Ang et al. ................... 438/787 |
| 2003/0013280 | A1 | * | 1/2003 | Yamanaka .................... 438/487 |
| 2003/0059535 | A1 | * | 3/2003 | Luo et al. ................ 427/255.28 |

FOREIGN PATENT DOCUMENTS

| JP | 62-079628 | 4/1987 |
| JP | 07-030114 | 1/1995 |
| JP | 10-321862 | 12/1998 |
| JP | 11-340238 | 12/1999 |
| JP | 2002-280560 | 9/2002 |
| JP | 2002-299607 | 10/2002 |

\* cited by examiner

*Primary Examiner*—Zandra V. Smith
*Assistant Examiner*—Khanh Duong
(74) *Attorney, Agent, or Firm*—Harness, Dickey & Pierce, P.L.C.

(57) ABSTRACT

A gate insulating film having an insulating film that contains at least nitrogen is formed on a substrate, and the gate insulating film is subjected to heat treatment for about 500 milliseconds or less using a flash lamp. Thereafter, a gate electrode is formed on the gate insulating film. Specifically, for example, a laminated film of $SiO_2$ film and an $Si_xN_{(1-x)}$ film, a laminated film of an $SiO_2$ film, HfSiO film, and an $Si_xN_{(1-x)}$ film, or the like, is formed in forming the gate insulating film.

15 Claims, 8 Drawing Sheets

METHOD FOR MANUFACTURING SEMICONDUCTOR DEVICE INCLUDING HEAT TREATING WITH A FLASH LAMP

BACKGROUND OF THE INVENTION

1. Field of the Invention

The present invention relates to a method for manufacturing a semiconductor device and a semiconductor device. More specifically, the present invention relates to a semiconductor device and a method for manufacturing thereof including a method for forming a gate insulating film.

2. Background Art

Generally as a gate insulating film in a semiconductor device, a thermal oxide film is often formed on an Si substrate; however, during the formation of the thermal oxide film, a slight structural defect may occur in the vicinity of the boundary between the thermal oxide film and the Si substrate. The structural defect generates a fixed charge in an oxide film close to the Si substrate, or interface states derived from dangling bonds in the vicinity of boundary between the thermal oxide film and the Si substrate. Since the interface states are generally considered to cause degradation of properties of the semiconductor device, the interface state density must be lowered. Therefore, a method for improving the state of the boundary between the thermal oxide film and the Si substrate by annealing at a relatively high temperature after the formation of the thermal oxide film has been studied.

On the other hand, concurrent with the high densification and down-sizing of semiconductor devices in recent years, the thickness of gate insulating films of transistors has also been reduced. When the thickness of a gate insulating film is reduced, leakage current increases to a considerable value in a conventional gate insulating film consisting of $SiO_2$. In order to inhibit increase in leakage current, a method for nitriding the surface of an $SiO_2$ film to convert the surface of the gate insulating film to an oxynitride film has been adopted. Particularly in a p-MOS, the use of such a nitriding oxide film can prevent the punch-through of boron in the gate electrode.

An example of methods for introducing nitrogen in an oxide film to form a gate insulating film is a method using heat treatment in a nitrogen-containing atmosphere, such as NO, $N_2O$ and $NH_3$, after the formation of the thermal oxide film, and thereby, the surface of the thermal oxide film can be nitrided. According to this method, the surface of an $SiO_2$ film can be nitrided to prevent leakage current, and the state of the boundary between the Si substrate and the thermal oxide film can be improved by heat treatment. Another method is a method for performing plasma nitriding after forming the thermal oxide film, and adding nitrogen to the surface of the thermal oxide film.

When the method for nitriding a thermal oxide film in an NO atmosphere or the like is used as described above, the temperature for introducing nitrogen is relatively high. If such a high temperature is used, nitrogen may be re-diffused to the vicinity of the boundary. If nitrogen is present in the vicinity of the boundary between the thermal oxide film and the Si substrate, the nitrogen causes an undesirable rise of interface states. Particularly in NBTI (negative bias temperature instability) state, the nitrogen distribution in the gate insulating film influences device characteristics significantly, causing the degradation of the device characteristics.

When plasma nitriding is used, since nitriding proceeds while substituting oxygen in a thermal oxide film with nitrogen, nitriding at a relatively low temperature is possible. However, in the boundary between the thermal oxide film and the Si substrate, a relatively poor boundary is easily formed causing the elevation of the interface state.

When devices having structures consisting of different thickness of gate insulating films are simultaneously formed, the application and peeling of a resist on and off the substrate must be repeated. Therefore, the boundary of the gate insulating film is significantly damaged, elevating the density of interface states.

In recent years, the use of a high-dielectric-constant film as a gate insulating film has been studied for reducing power consumption and preventing leakage current. In this case, an interfacial gate insulating film is formed between the high-dielectric-constant film and the Si substrate, and the interfacial gate insulating film is often a very thin film referred to as an IFL (interfacial layer). Particularly in the case of such a thin film, since the proportion of the boundary in the film is large, the effect of the interface states becomes larger, and the formation of a thin film of a higher reliability is required for reducing the density of interface states.

SUMMARY OF THE INVENTION

Therefore, the object of the present invention is to propose an improved method for manufacturing a semiconductor device so as to form a gate insulating film in a desirable interfacial state while inhibiting the diffusion of nitrogen to the vicinity of the boundary.

According to one aspect of the present invention, in a method for manufacturing a semiconductor device, a gate insulating film comprising an insulating film that contains nitrogen is formed on a substrate. A heat treatment is performed on the gate insulating film for about 500 milliseconds or less using a flash lamp. A gate electrode is formed on the gate insulating film.

According to another aspect of the present invention, a semiconductor device comprises a substrate, a gate insulating film and a gate electrode. The gate insulating film is formed on the substrate, and the gate electrode is formed on the gate insulating film. Further, the gate insulating film comprises a silicon oxide film formed on the substrate, a high-dielectric-constant film formed on the silicon oxide film, and a silicon nitride film formed on the high-dielectric-constant film. The high-dielectric-constant film contains nitrogen.

Other and further objects, features and advantages of the invention will appear more fully from the following description.

DETAILED DESCRIPTION OF THE PREFERRED EMBODIMENTS

Figure 1:
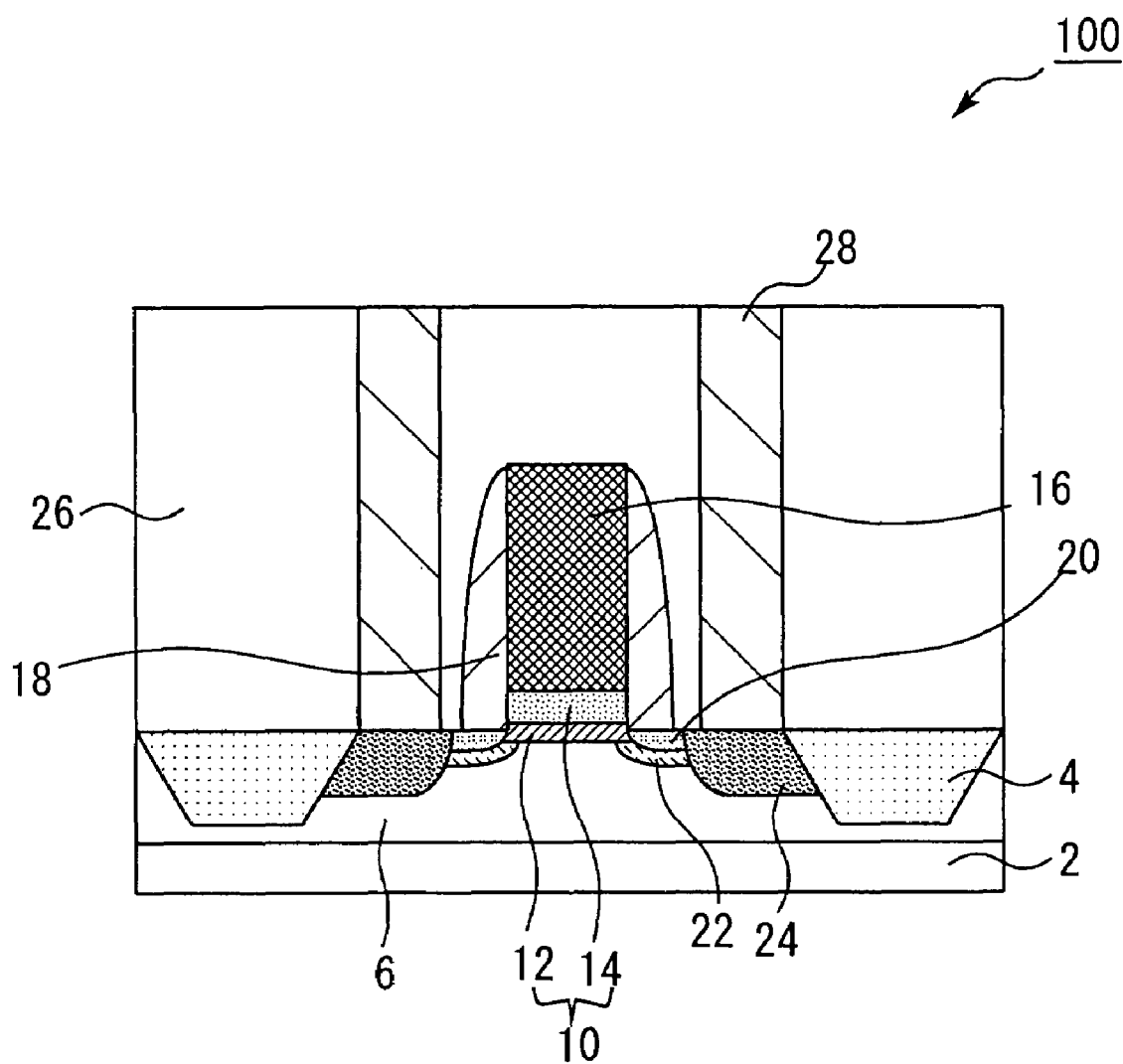
FIG. 1 is a schematic sectional view for illustrating a semiconductor device 100 in the first embodiment of the present invention.

The embodiments of the present invention will be described below referring to the drawings. In the drawings, the same or corresponding parts will be denoted by the same reference numerals, and the description thereof will be simplified or omitted.

First Embodiment

FIG. 1 is a schematic sectional view for illustrating a semiconductor device 100 in the first embodiment of the present invention.

In the semiconductor device 100, as FIG. 1 shows, an STI (shallow trench isolation region) 4 is formed on an Si substrate 2, and a well 6 is formed in the region isolated by the STI 4. On the Si substrate 2, an $SiO_2$ film 12 and an $Si_xN_{(1-x)}$ film 14 are laminated as a gate insulating film 10. On the $Si_xN_{(1-x)}$ film 14, a gate electrode 16 is formed. On the sides of the gate electrode 16 and the gate insulating film 10, a sidewall 18 is formed.

On the area in the vicinity of the surface of the Si substrate 2, on both sides of the gate electrode 16, an extension 20, which is an impurity-diffused layer having a relatively low impurity concentration, is formed. A halo 22 is formed so as to embrace the p-n junctions in the boundary between the extension 20 and the well 6. On the area outside the extension 20 in the Si substrate 2, and still on both sides of the sidewall 18, source-drain region 24, which are impurity-diffused layers having a relatively high impurity concentration, is formed.

On the Si substrate 2, an interlayer insulating film 26 is formed so as to bury the gate electrode 16 and the sidewall 18. In the interlayer insulating film 26, contact plug 28 connected to the source-drain region 24 is formed.

Thus constituted semiconductor device 100 structurally resembles conventional semiconductor devices. However, in the semiconductor device 100, the gate insulating film 10 has a laminated structure consisting of the $SiO_2$ film 12 and the $Si_xN_{(1-x)}$ film 14. By adopting the manufacturing method to inhibit the diffusion of N from the $Si_xN_{(1-x)}$ film 14 to the $SiO_2$ film 12, the N is prevented from being mixed in the vicinity of the boundary between the $SiO_2$ film 12 and the Si substrate 2.

Figure 2:
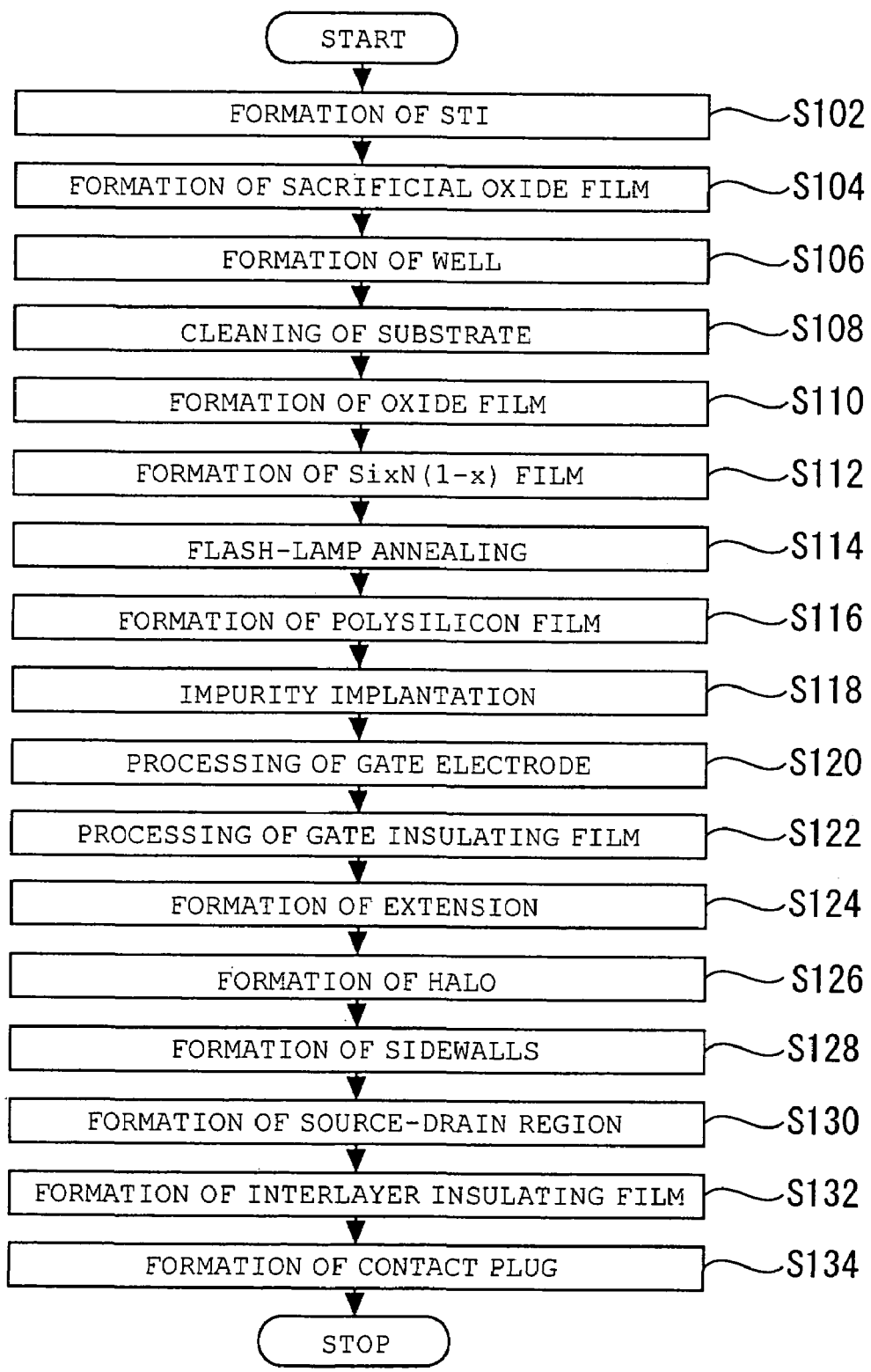
FIG. 2 is a flow diagram for illustrating a method for manufacturing a semiconductor device 100 according to the first embodiment of the present invention.

FIG. 2 is a flow diagram for illustrating a method for manufacturing a semiconductor device 100 according to the first embodiment of the present invention. FIGS. 3 to 8 are schematic sectional views for illustrating the state in each step of manufacturing the semiconductor device 100.

The method for manufacturing a semiconductor device 100 according to the first embodiment of the present invention will be described in detail referring to FIGS. 1 to 8.

Figure 3:
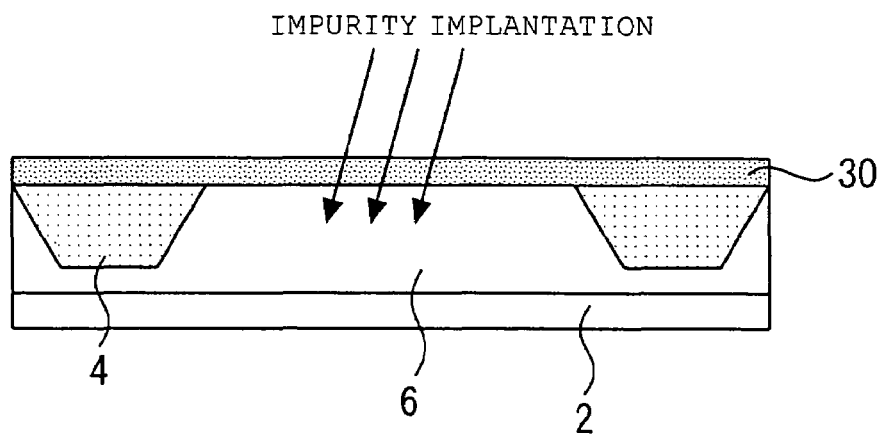
FIGS. 3 to 8 are schematic sectional views for illustrating the state in each step of manufacturing the semiconductor device 100 according to the first embodiment of the present invention.

First, as FIG. 3 shows, STI 4 is formed on an Si substrate 2 to isolate the Si substrate 2 into active regions (Step S102), and thereafter, a sacrificial oxide film 30 is formed on the Si substrate 2 (Step S104). Next, a well 6 is formed by implanting an impurity through the sacrificial oxide film 30 (Step S106). After forming the well 6, the substrate is cleaned before forming an oxide film (Step S108). Here, cleaning includes a step of removing the sacrificial oxide film 30 using wet etching, and a step of removing the natural oxide film.

Figure 4:
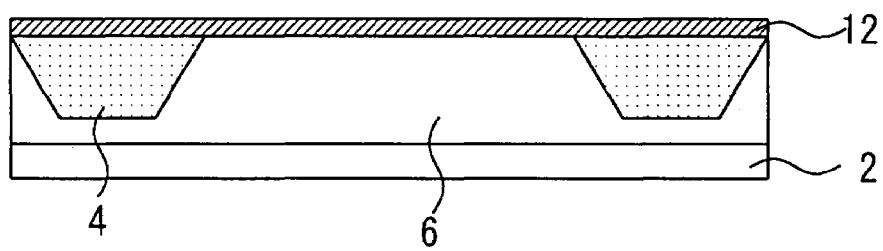

Next, as FIG. 4 shows, an $SiO_2$ film 12 is formed on the Si substrate 2 (Step S110). The $SiO_2$ film 12 is formed in a required thickness taking leakage current, power consumption and the like into consideration. Thereafter, an $Si_xN_{(1-x)}$ film 14 is formed on the $SiO_2$ film 12 (Step S112). Here, the $Si_xN_{(1-x)}$ film 14 is formed using ALCVD (atomic layer chemical vapor deposition) alternately supplying $Si_2Cl_6$ and $NH_3$. Specifically, the $Si_xN_{(1-x)}$ film 14 is formed by repeating the supply of $Si_2Cl_6$, purging by $N_2$ gas, the supply of $NH_3$, and purging by $N_2$ gas.

Figure 5:
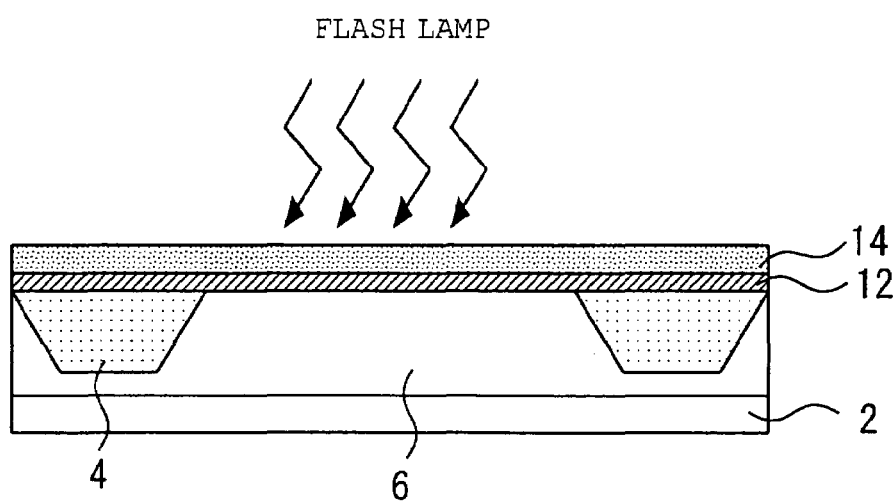

Next, as FIG. 5 shows, annealing is performed using a flash lamp whose main component is a visible light range (Step S114). Here, the annealing temperature is about 1000° C., and the annealing time is as extremely short as about 1 millisecond. This momentary heat treatment enables only the temperature of the area in the vicinity of the boundary between the Si substrate 2 and the $SiO_2$ film 12 to be effectively raised to about 1000° C., and the boundary to be reformed. At this time, since the annealing is performed for an extremely short time, the re-diffusion of N from the $Si_xN_{(1-x)}$ film 14 formed on the $SiO_2$ film 12 can be avoided.

Figure 6:
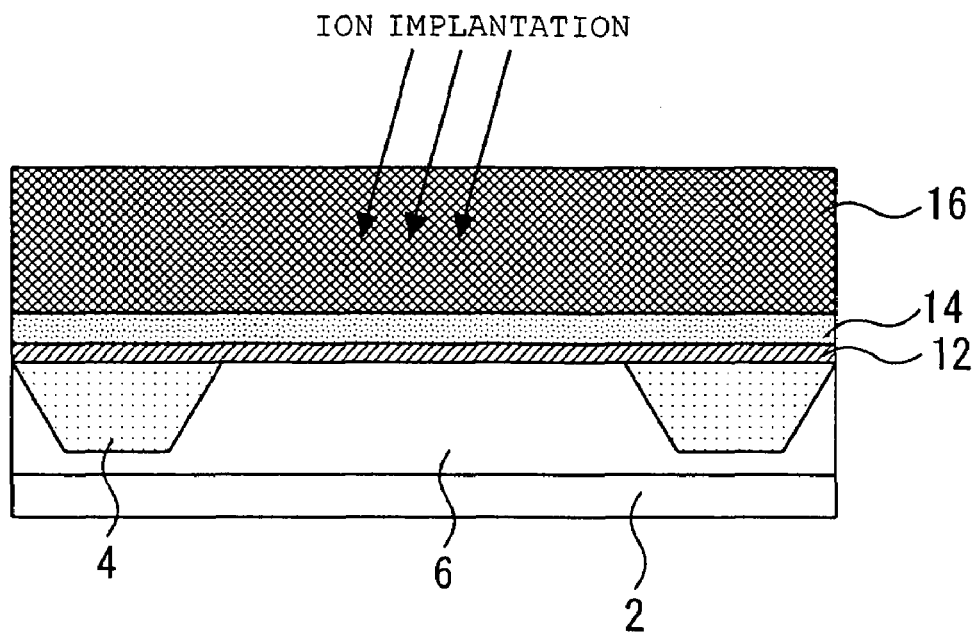

Next, as FIG. 6 shows, a polysilicon film is formed as a material film for the gate electrode 16 on the $Si_xN_{(1-x)}$ film 14 (Step S116). Thereafter, an impurity is implanted into the polysilicon film 16 (Step S118).

Figure 7:
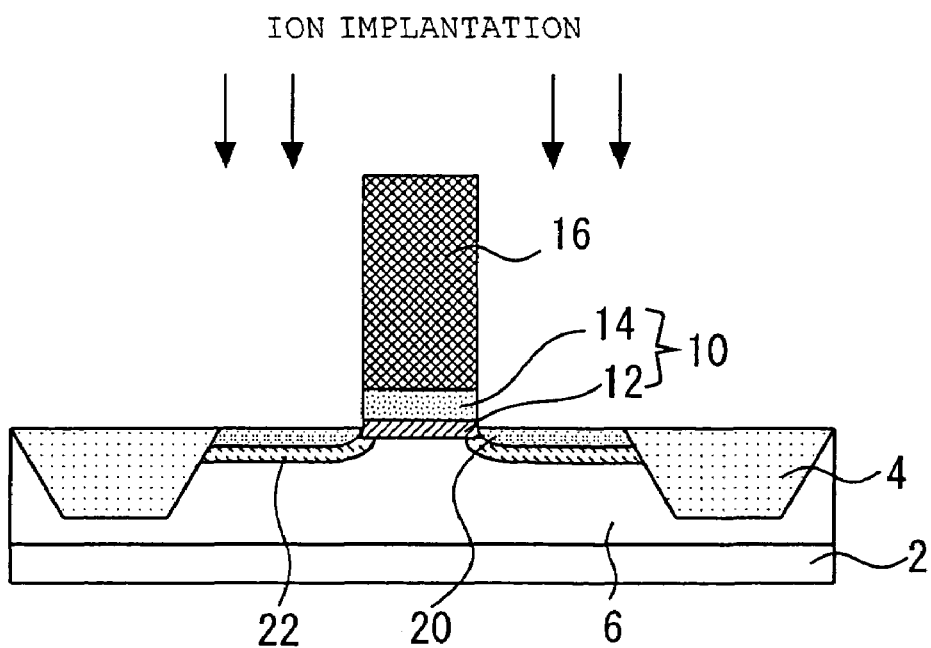

Next, as FIG. 7 shows, the polysilicon film is processed into a gate electrode 16 (Step S120). Here, a resist mask is formed on the polysilicon film by lithography, and the polysilicon film is etched using the resist mask to form the gate electrode 16 of a desired length. Thereafter, the $Si_xN_{(1-x)}$ film 14 and the $SiO_2$ film 12 are etched to form a gate insulating film 10 (Step S122). Here, the $Si_xN_{(1-x)}$ film 14 and the $SiO_2$ film 12 are etched in the same manner as in the processing of the gate electrode 16 using a resist mask, to form the gate insulating film 10 of the same width as the gate electrode 16. The resist mask is thereafter removed.

Next, ion implantation is performed to the Si substrate 2 using the gate electrode 16 as a mask to form extensions 20 (Step S124). Furthermore, ions of the type opposite to the type of the impurity implanted to the extension 20 are implanted using the gate electrode 16 as a mask to form a halo 22 so as to embrace the boundaries between the extension 20 and the well 6 (Step S126).

Figure 8:
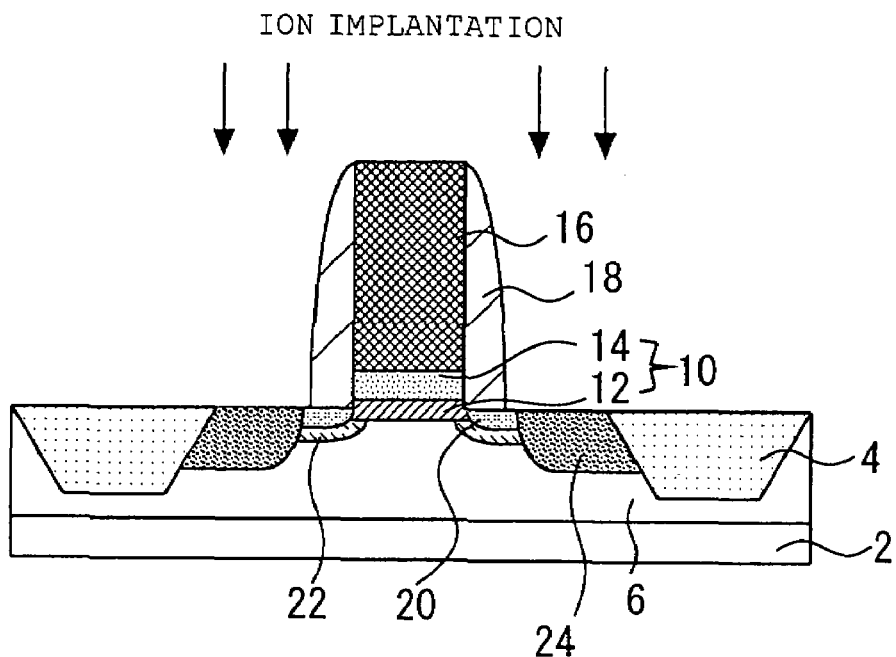

Next, as FIG. 8 shows, a sidewall 18 is formed on the sides of the gate electrode 16 and the gate insulating film 10 (Step S128). Here, an $SiO_2$ film, an SiN film and the like are deposited on the entire surface, and etch back is performed. Thereby, the $SiO_2$ film and the like are left only on the sides of the gate electrode 16 and the gate insulating film 10 to form the sidewalls 18.

Next, ion implantation is performed using the gate electrode 16 and the sidewalls 18 as the masks to form source-drain region 24, which are diffused layers having a relatively high impurity concentration (Step S130). The type of ions implanted here is the same as the ions implanted when the extension 20 is formed.

Next, an interlayer insulating film 26 is formed so as to bury the gate electrode 16, the sidewall 18 and the like (Step S132). Thereafter, contact plug 28 is formed (Step S134). The contact plug 28 is formed by forming contact hole passing through the interlayer insulating film 26 from the surface of the interlayer insulating film 26 to the upper surface of the source-drain region 24, and burying a conductive material in the contact hole.

As described above, the semiconductor device 100 as shown in FIG. 1 can be obtained.

According to the first embodiment, as described above, the laminate of an $SiO_2$ film 12 and an $Si_xN_{(1-x)}$ film 14 is used as the gate insulating film 10. The formation of the $Si_xN_{(1-x)}$ film 14 on the upper layer can prevent leakage current and the punch-trough of B or the like from the gate electrode. The heat treatment after the formation of the $Si_xN_{(1-x)}$ film 14 is performed using a flash lamp. Here, the use of the flash lamp enables to perform heat treatment at a temperature as high as 1000° C. for a time as short as about 1 millisecond. Thereby, since the temperature of the area in the vicinity of the boundary between the $SiO_2$ film 12 and the Si substrate 2 can be effectively raised to about 1000° C., a favorable boundary can be formed. In addition, since the heat treatment is momentarily performed for about 1 millisecond, N can be surely contained in the $Si_xN_{(1-x)}$ film 14, and the diffusion of N into the $SiO_2$ film can be prevented. Since N is not diffused into the area in the vicinity of the boundary, NBTI (negative bias temperature instability) can also be improved.

Figure 9:
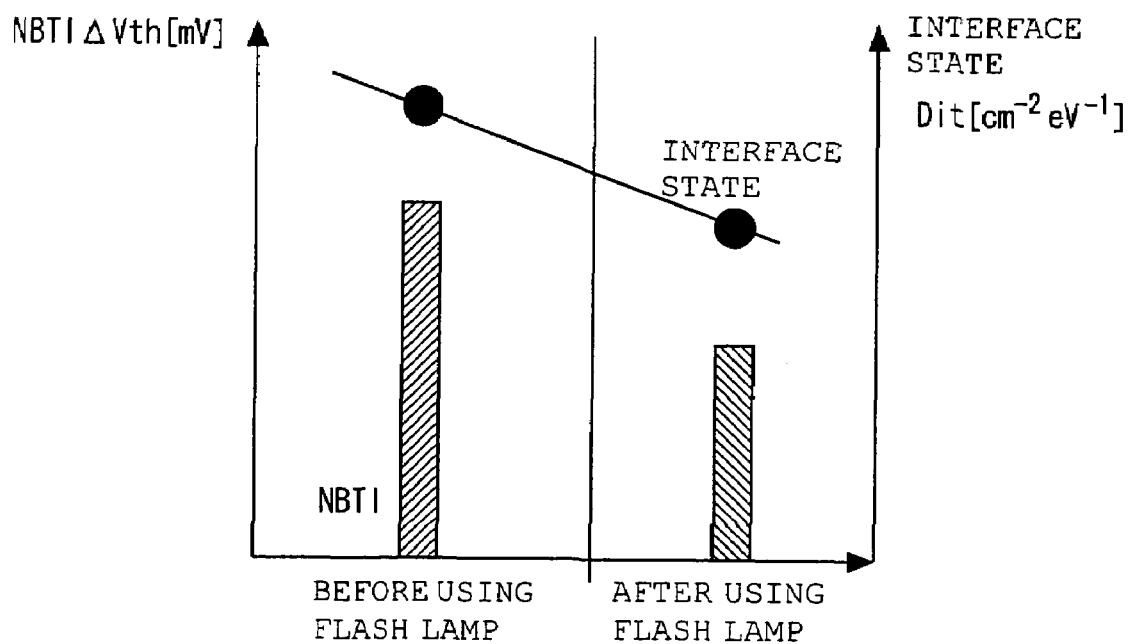
FIG. 9 is a graph showing the results of gate-leakage measurement and interface states, among the transistor characteristics of the semiconductor device 100 according to the first embodiment of the present invention.

FIG. 9 is a graph showing the results of gate-leakage measurement and interface states, among the transistor characteristics of the semiconductor device 100. In the graph, the left-hand side shows the case when the flash lamp was not used, and the right-hand side shows the case when the flash lamp was used. The bar graph shows NBTI, and the line graph plotted with black dots shows interface states.

As FIG. 9 shows, when compared with the conventional case when the flash lamp is not used, it is known that both the leakage current of the gate and the interface state of the device heat-treated using the flash lamp as in the first embodiment are lowered. Thus, according to the first embodiment, a semiconductor device having favorable device characteristics can be obtained.

In the first embodiment, the formation of an $Si_xN_{(1-x)}$ film 14 on an $SiO_2$ film is described. However, in the present invention, the gate insulating film is not limited to the laminate structure consisting of an $SiO_2$ film and an $Si_xN_{(1-x)}$ film 14. The gate insulating film may be, for example, a single layer insulating film containing nitrogen, a film formed by nitriding the surface of an $SiO_2$ film, or a multi-layer film formed by laminating an $Si_xN_{(1-x)}$ film on a nitrogen-added $SiO_2$ film. Specifically, for example, a single layer nitrogen-added oxide film formed at a relatively low temperature, such as a plasma-oxidized film; or a film formed by laminating an $Si_xN_{(1-x)}$ film on such a film; can be considered. In these cases also, the diffusion of N can be avoided while improving the state of the boundary, by an extremely short-time annealing using a flash lamp after the nitriding treatment at a relatively low temperature, or after forming the $Si_xN_{(1-x)}$ film. Therefore, a semiconductor device having favorable device characteristics with a low interface state and a reduced leakage current can be formed.

In the first embodiment, it is described that the heat treatment after forming an $Si_xN_{(1-x)}$ film 14 is performed under the conditions of a heat-treatment temperature of about 1000° C. and a treating time of about 1 millisecond using a flash lamp. However, the present invention is not limited to such a temperature or such a treating time. For example, the treating time may be decided taking the film thickness or the like in consideration; however, in order to avoid the diffusion of N more effectively, a short-time heat treatment for about 500 milliseconds or less is preferred.

Also in the first embodiment, the case wherein one transistor is formed on one substrate is described, simplistically. However, the present invention is not limited thereto, but a plurality of transistors may be formed on one substrate. Furthermore, the transistors include p-MOS transistors and n-MOS transistors. In this case, each gate insulating film can be formed performing masking steps or the like taking the thickness of the gate insulating films or the like required in each transistor into consideration.

Also in the present invention, the structure of the semiconductor device, the method and materials for forming each film, and the like are not limited to those described in the first embodiment. These may be accordingly selected within the scope of the present invention. For example, although a polysilicon film is used as the gate electrode 10 in the first embodiment, the present invention is not limited thereto, but amorphous silicon, a silicon-germanium film, a metal or the like may be used.

Second Embodiment

Figure 10:
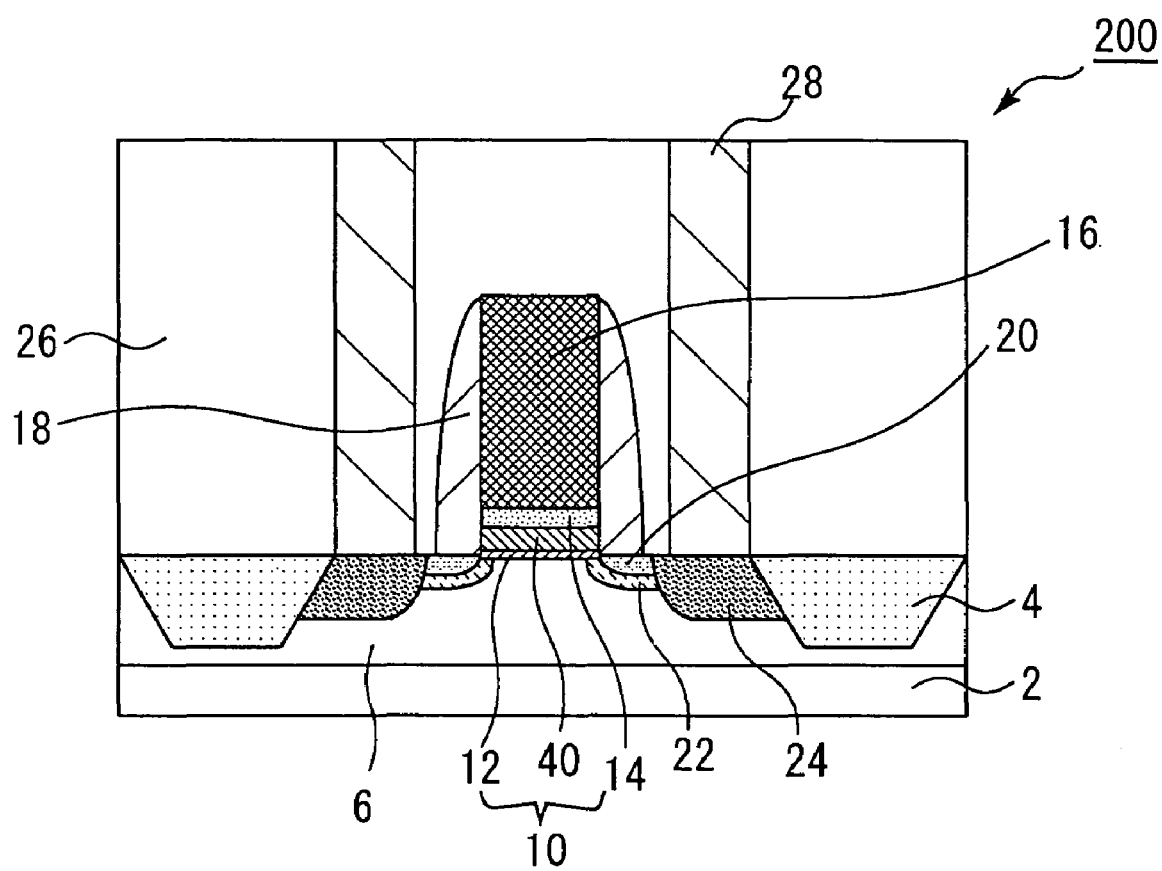
FIG. 10 is a schematic sectional view for illustrating a semiconductor device 200 in the second embodiment of the present invention.

FIG. 10 is a schematic sectional view for illustrating a semiconductor device 200 in the second embodiment of the present invention.

As FIG. 10 shows, the semiconductor device 200 resembles the semiconductor device 100 in the first embodiment.

However, while the gate insulating film 10 in the semiconductor device 100 is of a laminate structure of an $SiO_2$ film 12 and an $Si_xN_{(1-x)}$ film 14, the gate insulating film 10 in the semiconductor device 200 is composed of three layers of an $SiO_2$ film 12, an HfSiO film 40, which is a high-dielectric-constant film, and an $Si_xN_{(1-x)}$ film 14. Here, the thickness of the $SiO_2$ film 12 is as thin as about 0.2 to about 1.0 nm.

Furthermore, N of about $1\times10^{22}$ to $5\times10$ atm/cm$^3$ is added in the HfSiO film 40. By thus adding N in the HfSiO film 40, and by further forming the $Si_xN_{(1-x)}$ film 14, the semiconductor device 200 has a structure to more effectively restrain leakage current and the punch through of boron or the like.

Figure 11:
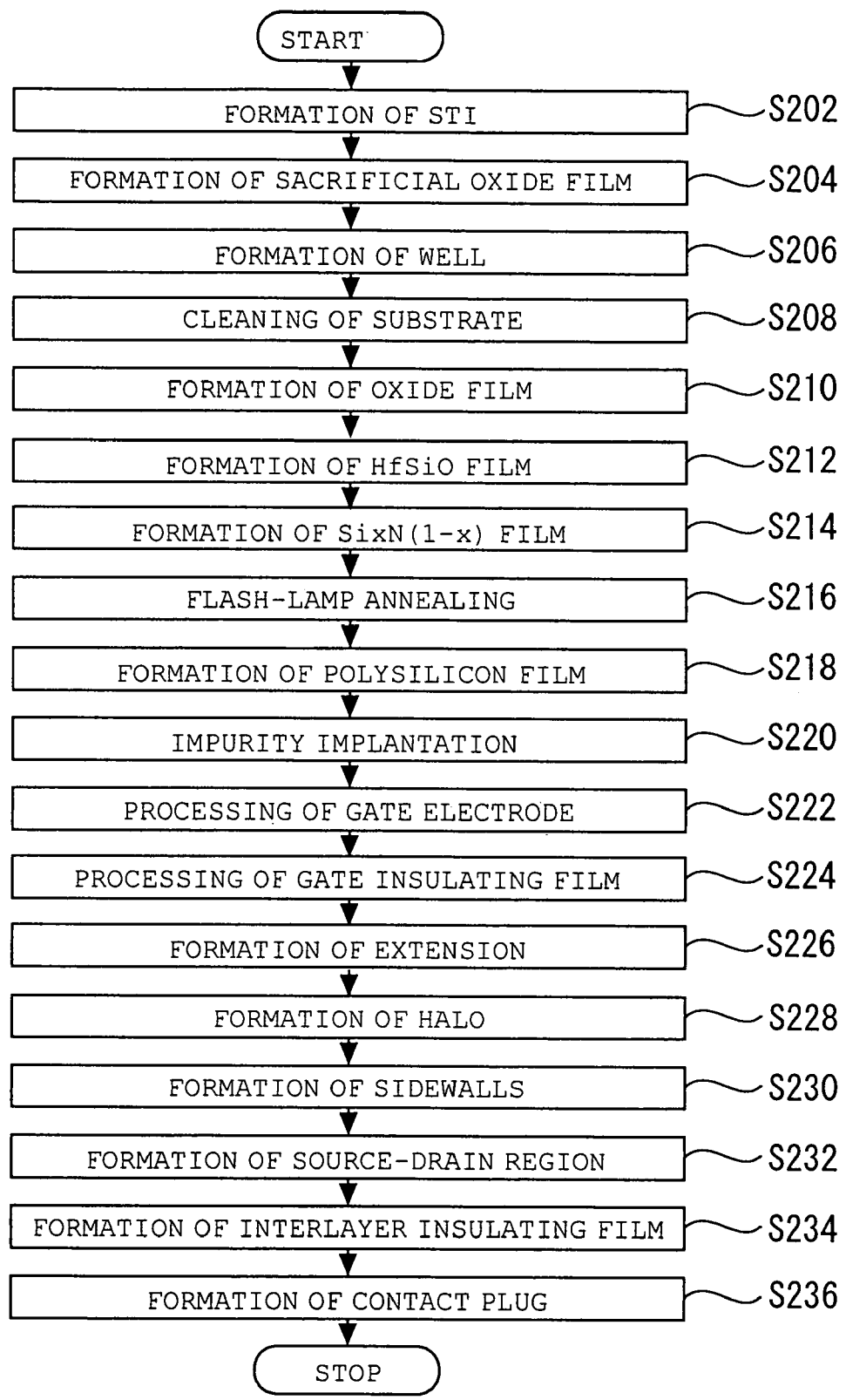
FIG. 11 is a flow diagram for illustrating a method for manufacturing a semiconductor device 200 according to the second embodiment of the present invention.
Figure 12:
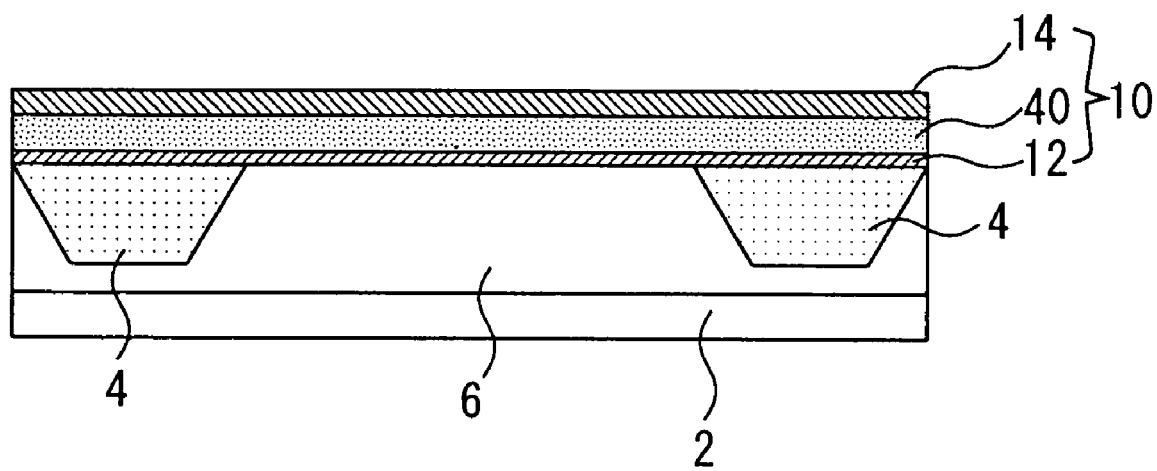
FIG. 12 is a schematic sectional view for illustrating a state in the process for manufacturing the semiconductor device 200 according to the second embodiment of the present invention.

FIG. 11 is a flow diagram for illustrating a method for manufacturing a semiconductor device 200 according to the second embodiment of the present invention. FIG. 12 is a schematic sectional view for illustrating a state in the process for manufacturing the semiconductor device 200.

The method for manufacturing the semiconductor device 200 resembles the method for manufacturing the semiconductor device 100. However, as described above, since the gate insulating film 10 in the semiconductor device 200 is composed of three layers including an HfSiO film 40, the method is different from the method for manufacturing the semiconductor device 100 in this aspect.

As a specific method, first, in the same manner as Steps S102 to S110 in the first embodiment, an $SiO_2$ film 12 is formed on an Si substrate 2 as FIG. 4 shows (Steps S202 to 210). Here, however, the $SiO_2$ film 12 is as very thin as about 0.2 to 1.0 nm as an interfacial gate insulating film.

Thereafter, an HfSiO film 40 is formed on the $SiO_2$ film 12 (Step S212). Here, the HfSiO film 40 is formed using an MOCVD (metal organic CVD) method. Then, nitrogen is introduced into the HfSiO film 40. Here, the HfSiO film 40 is annealed in an NH$_3$ atmosphere at about 700° C. for about 10 minutes to 60 minutes.

Thereafter, in the same manner as Step S112 in the first embodiment, an $Si_xN_{(1-x)}$ film 14 is formed on the HfSiO film 40 (Step S214).

Thereafter, in the same manner as Step S114 in the first embodiment, annealing is performed using a flash lamp (Step S216). Here, since the flash-lamp annealing raise the temperature of the boundary between the Si substrate 2 and the $SiO_2$ film 12 to as high as about 1000° C. instantly, a favorable boundary state can be obtained. On the other hand, since the heat-treating time is as short as about 1 millisecond, the re-diffusion of N from the $Si_xN_{(1-x)}$ film 14 and the HfSiO film 40 can be prevented.

Thereafter, in the same manner as Steps S116 to S134 in the first embodiment, the formation and treatment of the gate electrode and the like are performed (Steps S218 to S236), a semiconductor device 200 is obtained.

According to the second embodiment, as described above, an insulating film of a three-layer structure consisting of a thin $SiO_2$ film 12, an HfSiO film 40 including N, and an $Si_xN_{(1-x)}$ film 14 is used as the gate insulating film 10. Thereby, the leakage current and the punch through of boron or the like are effectively restrained.

Further, after the formation of the gate insulating film, annealing is performed for an extremely short time using a flash lamp. By the use of the flash lamp, the boundary can be reformed, and the diffusion of N into the boundary between the $SiO_2$ film 12 and the Si substrate 2 can be prevented.

In the second embodiment, an HfSiO film 40 is used as the high-dielectric-constant film. In the present invention, however, the high-dielectric-constant film is not limited to the HfSiO film. In general, a high-dielectric-constant film is a film having a higher specific dielectric constant than a silicon oxide film, and specifically, the examples include titanium oxides, zirconium oxides, lanthanum oxides, tantalum oxides, alumina oxides, and hafnium oxides. Other than the film of one of these examples, the laminate of two or more high-dielectric-constant films may also be used.

In the second embodiment, the case wherein N is added to an HfSiO film 40 is described. In the present invention, however, the high-dielectric-constant film is not limited to the one wherein N is added. Furthermore, the method for adding N in the high-dielectric-constant film is not limited to annealing in an $NH_3$ atmosphere, but other methods may also be used. For example, the step of adding N is not separately used, but by the treatment in a nitrogen-containing atmosphere when the $Si_xN_{(1-x)}$ film 14 is formed on the upper layer, N can be simultaneously added also in the high-dielectric-constant film.

In the second embodiment, a gate insulating film 10 wherein a thin $Si_xN_{(1-x)}$ film 14 is formed on an HfSiO film 40 is used. However, in the present invention, the gate insulating film 10 is not limited thereto, but may be a two-layer structure of an $SiO_2$ film 12 and an HfSiO film 40. Instead of the $SiO_2$ film 12, an SiON film with the surface of an $SiO_2$ film nitrided may also be used. In this case also, the diffusion of nitrogen in the vicinity of the SiON film surface into the area in the vicinity of the boundary can be prevented.

Annealing using a flash lamp is performed after forming the $Si_xN_{(1-x)}$ film 14 as the gate insulating film 10. However, the present invention is not limited thereto, but annealing may be performed after forming the HfSiO film 40, and before forming the $Si_xN_{(1-x)}$ film 14.

Since other parts are the same as those in the first embodiment, the description thereof will be omitted.

The steps of forming the gate insulating film of the present invention are implemented by carrying out, for example, Steps S110 to S112 of the first embodiment, or Steps S210 to S214 of the second embodiment; and the step of heat treatment of the present invention is implemented by carrying out, for example, Step S114 or Step S 216. The steps of forming the gate electrode of the present invention are implemented by carrying out, for example, Steps S116 to S120 of the first embodiment, or Steps S218 to S222 of the second embodiment.

The steps of forming the oxide film and the nitride film of the present invention are implemented by carrying out, for example, Steps S110 and S112 of the first embodiment, respectively. The steps of forming the oxide film, the high-dielectric-constant film and the nitride film of the present invention are implemented by carrying out, for example, Steps S210, S212, and S214 of the second embodiment, respectively.

According to one aspect of the present invention, after a nitrogen-containing insulating film has been formed as a gate insulating film, a heat treatment is performed for 500 milliseconds or less using a flash lamp. Thereby, since the heat treatment can be performed in the vicinity of the boundary between the insulating film and the substrate at a high temperature for a short time, a favorable interfacial state can be formed. On the other hand, since the heat treatment is performed for an extremely short time, the diffusion of N in the vicinity of the boundary with the substrate can be inhibited, and the elevation of the interface state due to the re-diffusion of N can be inhibited.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-307146, filed on Aug. 29, 2003 including specification, claims, drawings and summary, on which the Convention priority of the present application is based, are incorporated herein by reference in its entirety.

The invention claimed is:

1. A method for manufacturing a semiconductor device comprising:
    forming on a substrate, a gate insulating film comprising an insulating film that contains nitrogen;
    heat treating said gate insulating film for no more than about 500 milliseconds using a flash lamp, after forming said gate insulating film; and
    forming a gate electrode on said insulating film, wherein forming said gate insulating film comprises:
    forming an oxide film on said substrate; and
    forming a nitride film on said oxide film;
    wherein said nitride film has a composition of $Si_xN_{(1-x)}$.

2. The method for manufacturing a semiconductor device according to claim 1, wherein forming said gate insulating film further comprises:
    forming a high-dielectric-constant film on said nitride film.

3. The method for manufacturing a semiconductor device according to claim 1, wherein said nitride film is formed by plasma nitriding, after forming a thermal oxide film.

4. The method for manufacturing a semiconductor device according to claim 1, including forming said nitride film by atomic layer chemical vapor deposition, alternatively supplying $Si_2Cl_6$ and $NH_3$.

5. The method for manufacturing a semiconductor device according to claim 4, including treating said gate insulating film for no more than about 500 milliseconds using a flash lamp producing visible light.

6. The method for manufacturing a semiconductor device according claim 1, wherein said nitride film has a thickness of about 0.2 nm to 1.0 nm.

7. The method for manufacturing a semiconductor device according to claim 1, including forming said oxide film by plasma oxidation.

8. The method for manufacturing a semiconductor device according to claim 1, including treating said gate insulating film for no more than about 500 milliseconds using a flash lamp producing visible light.

9. A method for manufacturing a semiconductor device, comprising:
   forming, on a substrate, a gate insulating film comprising an insulating film that contains nitrogen;
   heat treating said gate insulating film for no more than about 500 milliseconds using a flash lamp, after forming said gate insulating film; and
   forming a gate electrode on said gate insulating film, wherein forming said gate insulating film comprises:
   forming an oxide film on said substrate;
   forming a high-dielectric-constant film on said oxide film; and
   forming a nitride film on said high-dielectric-constant film;
   wherein said nitride film has a composition of $Si_xN_{(1-x)}$.

10. The method for manufacturing a semiconductor device according to claim 9, further comprising adding nitrogen to said high-dielectric-constant film after forming said high-dielectric-constant film.

11. The method for manufacturing a semiconductor device according to claim 9, including heat treating after forming said high-dielectric-constant film.

12. The method for manufacturing a semiconductor device according to claim 9, including forming said nitride film by atomic layer chemical vapor deposition, alternately supplying $Si_2Cl_6$ and $NH_3$.

13. The method for manufacturing a semiconductor device according to claim 12, including treating said gate insulating film for no more than about 500 milliseconds using a flash lamp producing visible light.

14. The method for manufacturing a semiconductor device according to claim 9, wherein said nitride film has a thickness of about 0.2 nm to 1.0 nm.

15. The method for manufacturing a semiconductor device according to claim 8, including forming said oxide film by plasma oxidation.

* * * * *